United States Patent

[11] 3,596,204

[72] Inventor Arthur B. Vane
Menlo Park, Calif.
[21] Appl No 838,627
[22] Filed July 2, 1969
[45] Patented July 27, 1971
[73] Assignee Varian Associates
Palo Alto, Calif.

[54] TUNABLE COAXIAL CAVITY SEMICONDUCTOR NEGATIVE RESISTANCE OSCILLATOR

4 Claims, 4 Drawing Figs.

[52] U.S. Cl. 331/101, 331/107 R, 331/107 G, 333/82 B, 334/81
[51] Int. Cl. H03b 7/14
[50] Field of Search 331/107, 107 G, 107 T, 96, 97, 101, 117; 334/81; 317/251; 333/82 B

[56] References Cited

UNITED STATES PATENTS 3,239,729 3/1966 Napolin 334/81 X

FOREIGN PATENTS 1,108,372 4/1968 Great Britain 331/107 G

OTHER REFERENCES

Johnson, " Microwave Varactor Tuned Transistor Oscillator Design," IEEE Transactions on Microwave Theory and Techniques, Vol. MTT- 14, No. 11, Nov. 1966, pp. 564—572. 331-117 D.

*Primary Examiner*—Roy Lake
*Assistant Examiner*—Siegfried H. Grimm
*Attorneys*—Stanley Z. Cole and Gerald L. Moore

ABSTRACT: A microwave oscillator circuit is disclosed which employs a series connection of a lumped element capacitor and a semiconductor device capable of exhibiting negative resistance. The capacitance of the capacitor is series resonated with its self inductance to form the principal frequency determinative element of the resonance circuit, whereby broadband tuning is achieved with a relatively simple and thus inexpensive resonator circuit.

INVENTOR.
ARTHUR B. VANE

BY Stanley Z. Cole
ATTORNEY

TUNABLE COAXIAL CAVITY SEMICONDUCTOR NEGATIVE RESISTANCE OSCILLATOR

DESCRIPTION OF THE PRIOR ART

Heretofore, negative resistance semiconductor devices have been employed, at microwave frequencies, in distributed constant-type resonant circuits. Typically, such resonant circuits have comprised a section of coaxial line dimensioned to be an integral member of quarter wavelengths long to provide a distributed resonant circuit. The semiconductor negative resistance device, such as a Gunn diode, avalanche diode, tunnel diode, or the like, was connected in series or shunt with the center conductor of the coaxial resonator. The resonator structure which determined the operating frequency of the oscillator was tunable over a relatively wide band by means of an axially translatable tuning element, such as a contacting shorting end wall, or a dielectric ring. Typical of the prior art distributed constant microwave circuits are the ones described in the Proceedings of the IEEE of Jan. 1965, page 80, and Electronics Letters of Dec. 1966, Vol. 8, No. 12, p. 467 and 468. The problem with these prior art oscillator circuits is that they are relatively complex and therefore relatively expensive to manufacture. In addition, it would be desirable to reduce the size of the oscillator circuit.

SUMMARY OF THE PRESENT INVENTION

The principal object of the present invention is the provision of an improved microwave oscillator circuit for negative resistance semiconductor devices.

One feature of the present invention is the provision of a lumped element capacitor series connected with a negative resistance device, such lumped element capacitor having a self-inductance which is series resonated with the capacitance of the capacitor at the microwave operating frequency of the oscillator, whereby the size and complexity of the oscillator circuit is greatly reduced.

Another feature of the present invention is the same as the preceding feature wherein the capacitor is variable and has at least a pair of axially interdigitated coaxially disposed cylindrical conductors.

Another feature of the present invention is the same as any one or more of the preceding features including the provision of a conductive housing disposed enclosing the capacitor and the negative resistance device and means passing through a wall of the housing for coupling energy from the oscillator to a suitable load.

Another feature of the present invention is the same as any one or more of the preceding features wherein the negative resistance semiconductor device is a Gunn effect device.

Other features and advantages of the present invention will become apparent upon a perusal of the following specification taken in connection with the accompanying drawings wherein:

DESCRIPTION OF THE PREFERRED EMBODIMENTS

Figure 1:
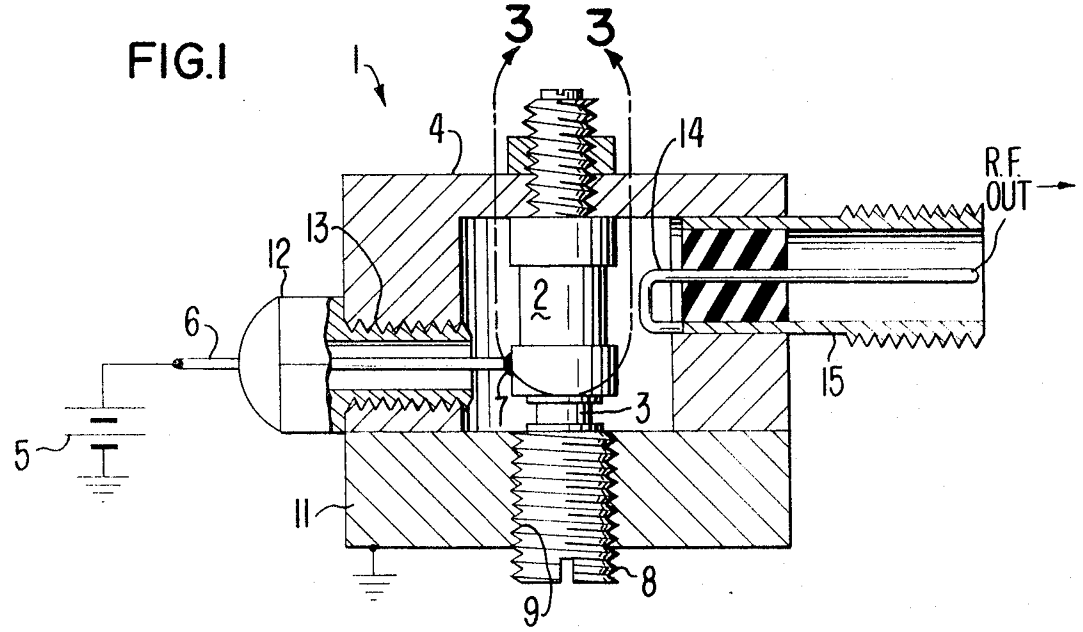
FIG. 1 is a longitudinal sectional view of a microwave oscillator employing features of the present invention.

Referring now to FIG. 1, there is shown a microwave oscillator circuit 1 incorporating features of the present invention. The microwave oscillator circuit 1 includes a series connection of a conventional trimmer capacitor 2 and a negative resistance semiconductor device 3, such as a Gunn effect diode, avalanche diode, etc. A conductive housing 4 encloses the series connected capacitor 2 and diode 3. A source of DC bias potential 5, as of 10 to 20 volts for a Gunn diode, is applied via lead 6 to a terminal 7 disposed intermediate the capacitor 2 and the negative resistance device 3. The housing 4 is operated at ground potential. A thermally and electrically conductive stud 8 is threaded through a tapped hole in end wall 11 of the housing 4, such stud 8 being in registration with the semiconductor device 3 such that one terminal of the device 3 is placed in good electrical and thermal contact with the housing 4 via the heat sinking stud 8, as of tellurium copper. A bypass capacitor 12 is connected between the lead 6 and the housing 4 for feeding the lead through an aperture 13 in the housing while bypassing to the housing 4 any microwave energy not suppressed by the inductance of such lead 6.

An output coupling loop 14 is disposed inside the housing 4 and is connected to a section of coaxial line 15 for coupling microwave energy from the oscillator circuit to a suitable load, not shown.

The housing 4 is preferably plated on its inside walls with a highly electrically conductive material such as silver or copper. Suitable material for the walls of the housing 4 include Invar, copper, or aluminum. Invar is particularly suitable as this material has a very low coefficient of thermal expansion, thereby minimizing detuning effects caused by thermal expansion or contraction of the housing 4. These detuning effects are generally small since the principal frequency determining element of the circuit is the capacitor 2 and its self-inductance. Another small detuning effect arises from the inductances and capacitances associated with the semiconductor material, the leads and the housing of the packaged diode 3.

The bias source of potential 5 is shown as a source of DC potential as is employed for CW operation of the oscillator. In some applications, it is desirable to produce a pulsed output in which case the source of bias potential 5 would be a source of pulsed potential, as of 30 or 40 volts for a Gunn diode, at a suitable duty factor such as to restrict the power lost as heat into the diode to about 10 watts.

Figure 2:
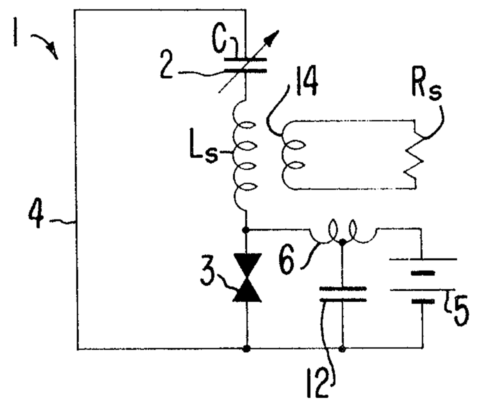
FIG. 2 is a simplified schematic circuit diagram for the oscillator circuit of FIG. 1.

Referring now to FIG. 2, there is shown the lumped element equivalent circuit for the microwave oscillator circuit 1 of FIG. 1. The circuit includes a series connection of capacitor 2 with its self-inductance $L_s$ both connected in series with the semiconductor negative resistance device 3. The housing 4 forms a conductive connection between the capacitor 2 and the diode 3 and comprises a small inductive reactance which is small in comparison to the capacitance of capacitor 2 and the inductance of the self-inductance $L_s$, such latter two elements forming the principal frequency determinative elements of the series resonant circuit.

The capacitance of capacitor 2 is varied to tune the microwave series self-resonant frequency of the capacitor 2 to the desired frequency of operation of the oscillator 1. A load resistance $R_s$ is magnetically coupled to the series resonant circuit via coupling loop 14. The bias potential supplied from bias source 5, as applied across the negative resistance device 3, biases the device into a region of negative resistance such that the circuit breaks into sustained oscillation near the microwave series self-resonant frequency of the capacitor 2. A low pass filter is formed by the series inductance of the bias lead 6 and the capacitance of bypass capacitor 12 to prevent coupling of microwave energy from the resonant circuit into the bias source 5.

Figure 3:
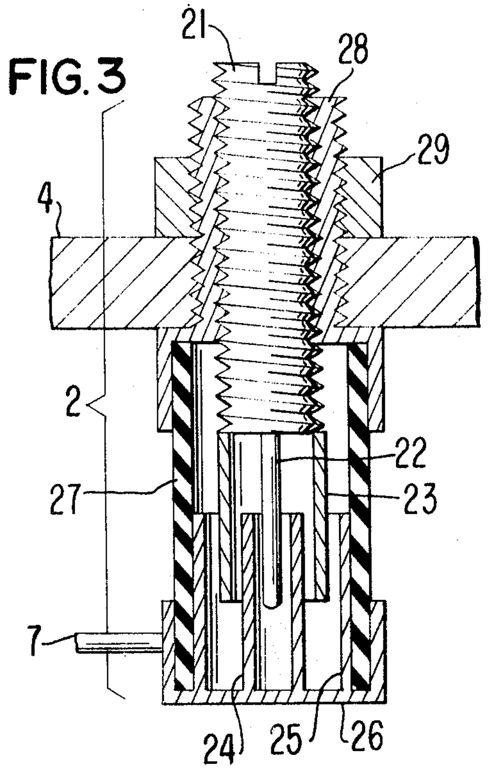
FIG. 3 is an enlarged sectional view of a portion of the structure of FIG. 1 delineated by line 3–3.

Referring now to FIG. 3 the trimmer capacitor 2 is shown in greater detail. The capacitor 2 is a conventional commercially available trimmer capacitor of the microminiature size. A typical example of such a capacitor 2, for use in a circuit operating at a center frequency of 5 gigaHertz, is a JMC Model 4702 which is a microminiature trimmer capacitor having a capacity range of 0.35 picofarads to 3.5 picofarads and a Q at 250 megahertz of greater than 2,000, and a temperature coefficient of 50±50 parts per million per degree C. The length within the housing 4 is 0.281 inch and the greatest diameter is 0.140 inch.

The trimmer capacitor 2 includes a centrally disposed screw 21 having a pair of cylindrical conductive members 22 and 23 coaxially disposed of each other and of the screw 21. Cylindrical members 22 and 23 are affixed to the inner end of the screw 21 to form one plate structure of the capacitor 2. The cylindrical members 22 and 23 are axially interdigitated with a second pair of cylindrical conductive members 24 and 25 carried from a conductive disc 26. The disc 26 and axially coextensive coaxially disposed cylindrical members 24 and 25 form the second plate of the capacitor 2. A hollow cylindrical insulator body 27, as of alumina, surrounds the interdigitated plates of the capacitor and is joined at one end to the disc 26 and at the other end to an internally threaded conductive sleeve 28. The internal threads of the sleeve 28 threadably mate with the external threads on the screw 21, such that by turning screw 21 the mutually opposed area of the interdigitated cylindrical members 22—25 is varied to vary the capacitance of the capacitor 2. The sleeve 28 is externally threaded for mating with internal threads of a tapped bore in the upper wall of the housing 4. A locknut 29 is threaded over the external threads of the sleeve 28 for locking the capacitor 2 in position to the end wall of the housing 4.

Figure 4:
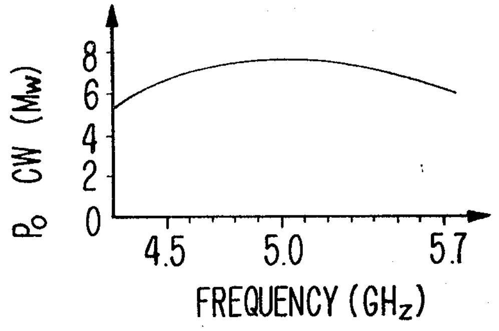
FIG. 4 is a plot of power output in milliwatts CW versus frequency in gigaHertz for a typical oscillator of the present invention.

Referring now to FIG. 4, there is shown a plot of CW power output in milliwatts versus frequency in gigaHertz depicting the output performance characteristic of the microwave oscillator 1 of FIG. 1 employing a Gunn effect transit time mode diode 3. As is seen from FIG. 4, the output power of a particular gallium arsenide diode can be tuned over the relatively broad range of 4.5 to 5.7 gigaHertz without an appreciable reduction in power output. Substantially greater peak power outputs have been obtained utilizing pulsed operation with a duty cycle of approximately 10 percent. For example, 20 watts peak power at 4.3 gigaHertz has been obtained. Oscillators 1 of the present invention are operable over the frequency range of 2 to 8 GHz.

The principal advantage of the microwave oscillator 1 incorporating features of the present invention is that the principal frequency determinative element of the circuit is the trimmer capacitor 2 which is an inexpensive commercially available item. Therefore, the size and complexity of the microwave oscillator circuit is substantially reduced. Use of the lumped capacitor 2 greatly reduces the size of the circuit. For example, the equivalent prior art oscillator circuit described in the aforementioned Electronics Letters would have a length of approximately 4 inches, whereas the equivalent length for the oscillator circuit 1 of the present invention is approximately one-half inch.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

I claim:

1. A microwave oscillator circuit tunable for operation within a certain frequency range of interest, comprising conductive means forming a cylindrical cavity, means for extracting microwave energy from said cavity and, coaxially mounted within said cavity and electrically connected between the end walls thereof in series circuit relation, a negative resistance semiconductor device and a variable capacitor, said capacitor having at least a pair of axially interdigitated coaxially disposed cylindrical conductors which are axially translatable relative to each other to vary the capacitance of said capacitor, said interdigitated cylindrical conductors being dimensioned and positioned relative to one another such that the capacitance of said capacitor can be tuned to resonance with the self-inductance of said capacitor at any frequency within said range by axial translation of said cylindrical conductors.

2. The apparatus of claim 1 further including an electrical lead extending insulatedly through a cylindrical wall of said cavity means and connected to the juncture of said semiconductor device and said capacitor for applying a bias potential to said semiconductor device.

3. The apparatus of claim 1 wherein said semiconductor negative resistance device is a bulk effect diode.

4. The apparatus of claim 3 wherein said bulk effect diode is a Gunn effect diode.